(12) United States Patent
Adachi et al.

(10) Patent No.: US 8,188,556 B2
(45) Date of Patent: May 29, 2012

(54) SEMICONDUCTOR SENSOR AND METHOD OF MANUFACTURING THE SAME

(75) Inventors: Yoshitaka Adachi, Moriyama (JP); Katsuyuki Inoue, Kizugawa (JP)

(73) Assignee: OMRON Corporation, Kyoto (JP)

( * ) Notice: Subject to any disclaimer, the term of this patent is extended or adjusted under 35 U.S.C. 154(b) by 210 days.

(21) Appl. No.: 12/712,756

(22) Filed: Feb. 25, 2010

(65) Prior Publication Data

US 2010/0219490 A1    Sep. 2, 2010

(30) Foreign Application Priority Data

Mar. 2, 2009   (JP) ................................. 2009-047564

(51) Int. Cl.
*H01L 29/84* (2006.01)
(52) U.S. Cl. ........ 257/415; 257/416; 257/417; 257/418; 257/419; 257/420; 257/E29.324
(58) Field of Classification Search .......... 257/415–420, 257/E29.324
See application file for complete search history.

(56) References Cited

U.S. PATENT DOCUMENTS

| 6,619,133 | B1 | 9/2003 | Goshoo et al. | |
|---|---|---|---|---|
| 7,569,413 | B2 * | 8/2009 | Kasai et al. | 438/53 |
| 7,786,541 | B2 | 8/2010 | Izuo et al. | |
| 2006/0050905 | A1 * | 3/2006 | Ohbayashi et al. | 381/175 |
| 2007/0196946 | A1 | 8/2007 | Kasai et al. | |

FOREIGN PATENT DOCUMENTS

| JP | 58-052882 A | 3/1983 |
|---|---|---|
| JP | 04-009770 A | 1/1992 |
| JP | 2002-208708 A | 7/2002 |
| JP | 3506932 A | 12/2003 |
| JP | 2007-225362 A | 9/2007 |
| KR | 10-2008-0068079 A | 7/2008 |

OTHER PUBLICATIONS

Japanese Office Action issued in Japanese Application No. 2009-047564 dated Sep. 20, 2011 and English translation thereof 5 pages.
English abstract of JP 58-052882 published on Mar. 29, 1983, 1 page.
Korean Office Action issued in Korean Application No. 10-2010-0005909 dated Apr. 18, 2011 and English translation thereof, 8 pages.
Japanese Office Action issued in Japanese Application No. 2009-047564 dated May 24, 2011 and English translation thereof, 6 pages.
English Abstract of JP 04-009770 published on Jan. 14, 1992, 1 page.

* cited by examiner

*Primary Examiner* — Cuoung Q Nguyen
*Assistant Examiner* — Tran Tran
(74) *Attorney, Agent, or Firm* — Osha Liang LLP

(57) ABSTRACT

A semiconductor sensor has a first semiconductor layer as a base, an insulating layer formed on the first semiconductor layer, and a second semiconductor layer formed on the insulating layer. A recess is formed from a bottom surface of the first semiconductor layer up to a top surface of the insulating layer. The second semiconductor layer is covered with the insulating layer in an outer circumference of a top surface of the recess. A sensitive region of the second semiconductor layer is exposed in a region except the outer circumference of the top surface of the recess.

2 Claims, 7 Drawing Sheets

FIG. 1

(Prior Art)

SEMICONDUCTOR SENSOR AND METHOD OF MANUFACTURING THE SAME

BACKGROUND OF THE INVENTION

1. Technical Field

The present invention relates to a semiconductor sensor with a diaphragm (a sensitive region of a semiconductor thin film) and a method of manufacturing the semiconductor sensor.

2. Related Art

Small-sized pressure sensors, vibration sensors and the like using semiconductor substrates have diaphragms for detecting pressures and vibrations. Methods of manufacturing diaphragms in semiconductor substrates include a method using a silicon on insulator (SOI) wafer in which a Si substrate and a thin film layer are bonded with an insulating layer interposed therebetween as disclosed in Japanese Patent No. 3506932 and Japanese Unexamined Patent Publication No. 2002-208708.

Figure 1:
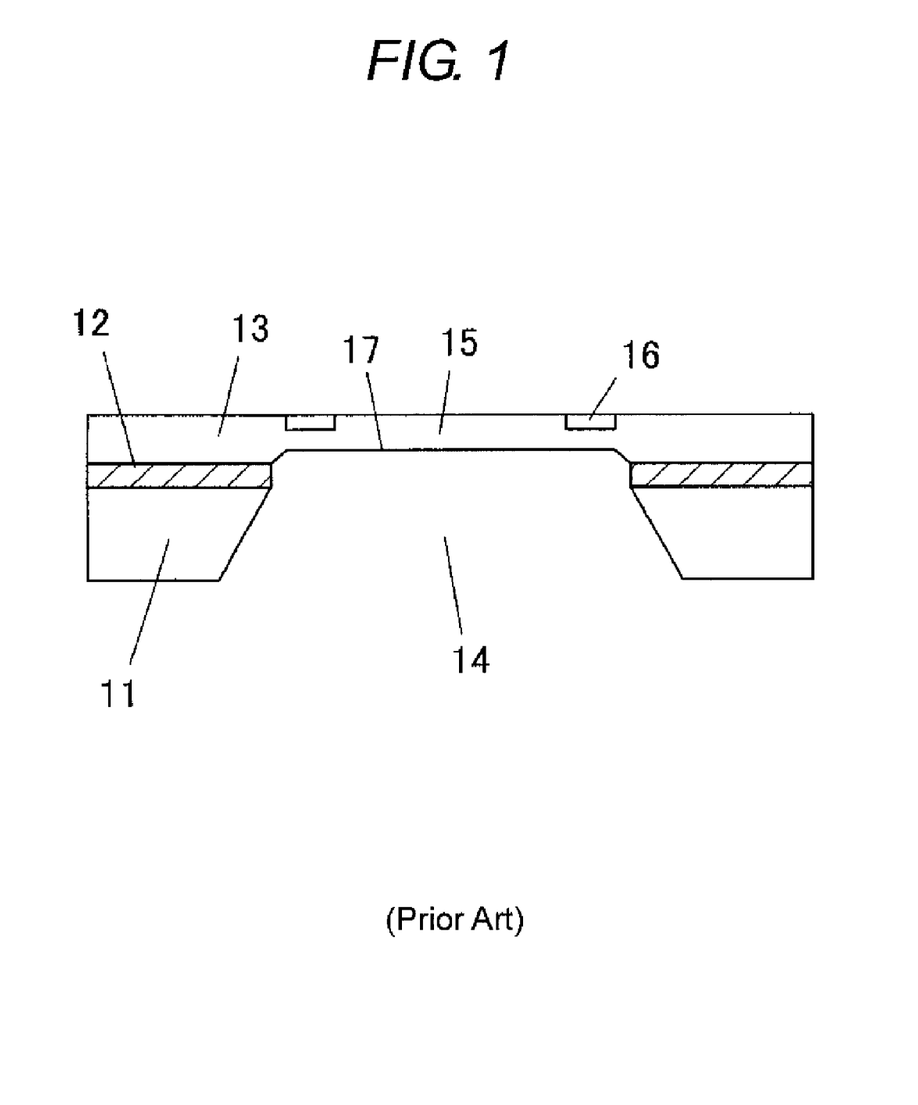
FIG. 1 is a cross-sectional view showing a structure of a conventional pressure sensor.

For example, in a semiconductor pressure sensor disclosed in Japanese Patent No. 3506932, which is shown in FIG. 1, an SOI wafer in which an insulating layer 12 ($SiO_2$ layer) and a Si thin film layer 13 (Si layer) are laminated on a Si substrate 11 (Si layer) is used. The Si substrate 11 and the insulating layer 12 are partially etched from a bottom surface of the Si substrate 11 to form a diaphragm 15 made of the Si thin film layer 13 on a cavity 14, and strain gauges 16 are provided at edges of the diaphragm 15.

Further, in the semiconductor pressure sensor of Japanese Patent No. 3506932, a bottom surface of the diaphragm 15 is etched to the depth of about 5 to 10 μm in the cavity 14 by wet etching to dig a depression 17 on the bottom surface of the diaphragm 15.

The reason why the bottom surface of the diaphragm 15 is etched in the pressure sensor of Japanese Patent No. 3506932 is as follows. One of conventional pressure sensors leaves an insulating layer intact without etching, thereby forming a diaphragm of a double-layer structure made up of the insulating layer and a Si thin film layer. However, in such a pressure sensor, the diaphragm is distorted to have temperature characteristics because of a difference in coefficient of thermal expansion between the insulating layer and the Si thin film layer. The deformation of the diaphragm causes cracking to occur in the insulating layer. There is therefore a possibility that cracking extends to the Si thin film layer to break the diaphragm. Consequently, in a pressure sensor of Japanese Patent No. 3506932, the insulating layer 12 in the cavity 14 is removed, and further the bottom surface of the diaphragm 15 is also etched such that the depression 17 is dug down. Thereby the insulating layer 12 is completely removed.

Likewise, in a pressure sensor of Japanese Unexamined Patent Publication No. 2002-208708, a Si substrate and an insulating layer are removed by partial etching from a bottom surface of an SOI wafer to form a diaphragm. Further, the bottom surface of the diaphragm is etched such that a depression is dug down.

SUMMARY

In the pressure sensors disclosed in Japanese Patent No. 3506932 and Japanese Unexamined Patent Publication No. 2002-208708, etching depth is controlled by time management at the time of digging down a depression on a bottom surface of a diaphragm. No matter how accurate the time management is, however, various variable factors in a process of etching a diaphragm cannot be avoided. The variable factors lead to variations in depth of a depression, making it difficult to uniform the thickness of a diaphragm. There has been a possibility that if variations in thickness of a diaphragm occur, they manifest themselves as variations in sensitivity of a pressure sensor.

Moreover, providing a depression on the bottom surface of a diaphragm causes a corner (inner corner) in a depression. Stress is likely to concentrate on the corner when the diaphragm is deformed. There has been a possibility that the diaphragm is broken from the corner.

One or more embodiments of the present invention provides a semiconductor sensor whose diaphragm is resistant to breakage and in which variations in sensor sensitivity are small, and a method of manufacturing the semiconductor sensor.

In accordance with one aspect of the present invention, a semiconductor sensor includes: a first semiconductor layer as a base; an insulating layer formed on the first semiconductor layer; and a second semiconductor layer formed on the insulating layer, wherein a recess is formed from a bottom surface of the first semiconductor layer up to a top surface of the insulating layer, the second semiconductor layer is covered with the insulating layer in an outer circumference of a top surface of the recess, and a sensitive region of the second semiconductor layer is exposed in a region except the outer circumference of the top surface of the recess.

In a semiconductor sensor in accordance with one aspect of the present invention, the insulating layer is removed in most of the sensitive region (diaphragm) of the second semiconductor layer. This reduces temperature characteristics in the semiconductor sensor because of a difference in coefficient of thermal expansion between the sensitive region and the insulating layer, which occur in cases where an entire bottom surface of the sensitive region is covered with an insulating layer. Further, cracking never expands from the insulating layer to the sensitive region.

Furthermore, since an outer circumference of the sensitive region of the second semiconductor layer is covered with the insulating layer slightly remaining on the bottom surface of the sensitive region and is reinforced by the insulating layer, the sensitive region becomes resistant to breakage even if the sensitive region is repeatedly deformed. Thus, in accordance with one aspect of the invention, the sensitive region of the second semiconductor layer becomes resistant to breakage. In addition, since the film thickness of the sensitive region need not be decreased by digging down the bottom surface of the sensitive region, the possibility of variations in sensitivity of the semiconductor sensor is reduced.

According to the semiconductor sensor of another embodiment of the present invention, the sensitive region has a film thickness equal to a film thickness of a region other than the sensitive region of the second semiconductor layer. In accordance with this embodiment, since the sensitive region of the second semiconductor layer is not made thinner than a region other than the sensitive region by etching, the possibility of variations in sensitivity of the semiconductor sensor because of variations in film thickness of the sensitive region is reduced. Further, a bottom surface of the second semiconductor layer is flat. This reduces stress concentration due to a corner, making the sensitive region resistant to breakage.

According to the semiconductor sensor of another embodiment of the present invention, in the insulating layer covering the second semiconductor layer in the outer circumference of the top surface of the recess, a film thickness becomes thinner from an outer circumference side of the sensitive region toward a center of the sensitive region. In accordance with this embodiment, the insulating layer covering the outer circumference of the sensitive region becomes gradually thinner toward the tip. This makes it difficult for deformation of the sensitive region to be inhibited by the insulating layer.

In accordance with another aspect of the present invention, a method of manufacturing the semiconductor includes the steps of: (a) forming a masking section on the bottom surface of the first semiconductor layer of an SOI substrate obtained by bonding the first semiconductor layer made of Si and the second semiconductor layer made of Si with the insulating layer made of $SiO_2$ interposed therebetween, and making an opening in the masking section at a place where the recess is to be formed; (b) performing dry etching or wet etching of the first semiconductor layer through the opening of the masking section to expose the insulating layer in the etched recess; (c) performing dry etching of the insulating layer up to a midpoint of the insulating layer exposed in the recess; and (d) etching the insulating layer by dry etching with a higher selectivity between $SiO_2$ and Si than the dry etching of the insulating layer in step (c), and stopping the dry etching at a stage where the second semiconductor layer is exposed from the insulating layer at a center of the outer circumference of the top surface in the recess and the insulating layer remains on the top surface in the recess.

In accordance with a method of manufacturing the semiconductor sensor in accordance with one aspect of the invention, a semiconductor sensor having effects as mentioned above can be manufactured. Further, at the time of etching the insulating layer, the insulating layer is etched up to the midpoint at a relatively fast etching rate by dry etching, and subsequently the remaining insulating layer is removed by etching with a relatively high etching selectivity. This makes it possible to expose the second semiconductor layer from the insulating layer, in the top central portion in the recess, in a relatively short manufacturing time, and to leave the insulating layer at a top outer circumference in the recess. Further, by adjusting a timing of changing from fast etching to slow etching, the shape and dimensions of the insulating layer remaining at the outer circumference of the sensitive region can be adjusted.

DETAILED DESCRIPTION

Hereinafter, preferred embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

Figure 2:
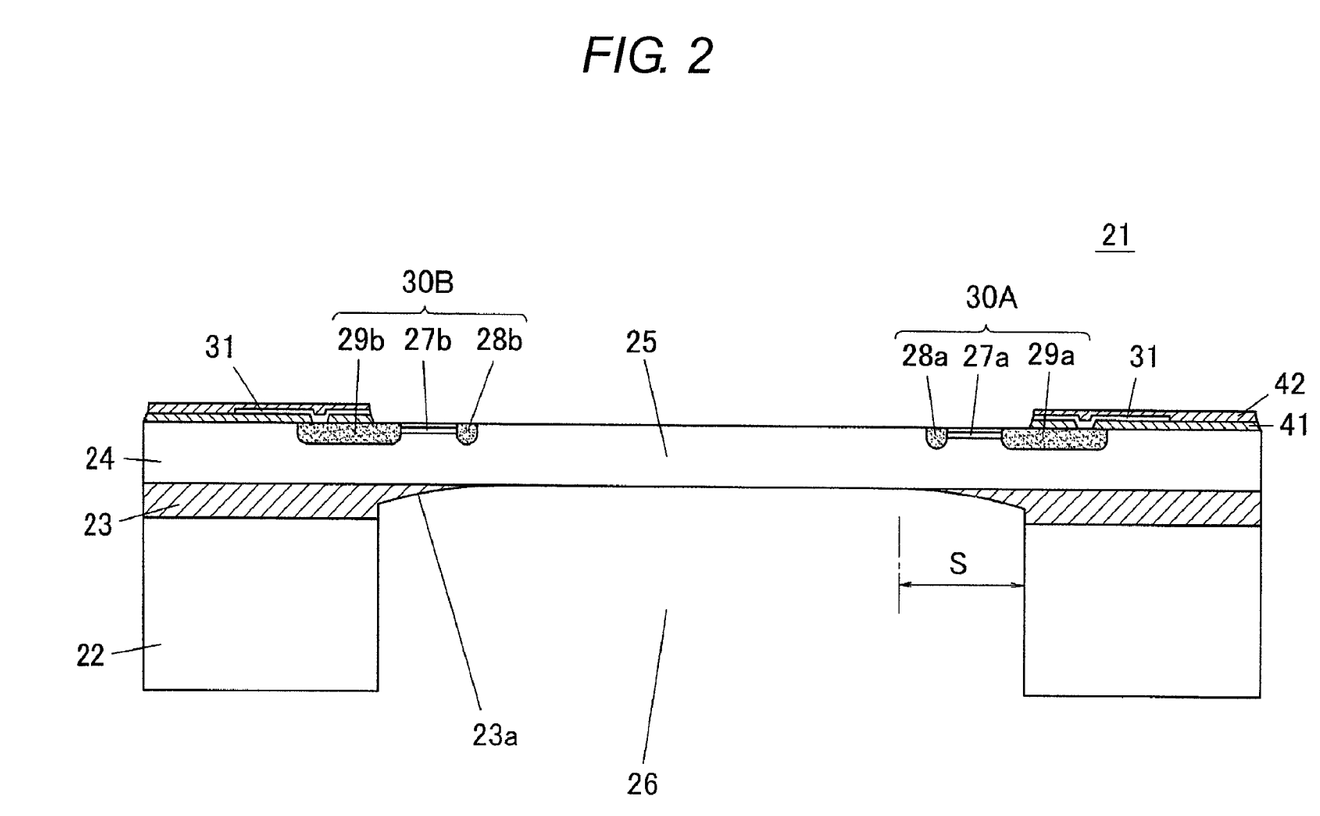
FIG. 2 is a cross-sectional view showing a pressure sensor according to a first embodiment of the invention.

FIG. 2 is a sectional view showing a semiconductor sensor according to a first embodiment of the invention, that is, a pressure sensor 21. With reference to FIG. 2, the structure of the pressure sensor 21 is described. As shown in FIG. 2, the pressure sensor 21 is manufactured using an SOI substrate. An SOI substrate is obtained by bonding an N-type Si substrate 22 (first semiconductor layer) and an N-type Si thin film 24 (second semiconductor layer) with a $SiO_2$ film 23 (insulating layer) interposed therebetween. The pressure sensor 21 has a round diaphragm 25 (sensitive region that is not fixed to the Si substrate 22) formed of part of the Si thin film 24. The diaphragm 25 is slightly displaced in the film direction by a pressure of an object being sensed.

The pressure sensor 21 has a cylindrical recess 26 (cavity) formed from a bottom surface of the Si substrate 22 up to a top surface of the $SiO_2$ film 23, in accordance with a bottom surface of the diaphragm 25. In a top outer circumference of the recess 26, the $SiO_2$ film 23 covers a bottom outer circumference of the diaphragm 25, and the entire bottom surface of the diaphragm 25 is exposed in its region except an outer circumference of a top surface of the recess 26. The $SiO_2$ film 23 covering the bottom outer circumference of the diaphragm 25 tapers off at its bottom surface such that its film thickness gradually decreases from an outer circumferential edge of the diaphragm 25 toward the center of the diaphragm 25. Hereinafter, a portion covering the bottom outer circumference of the diaphragm 25, which is formed of the $SiO_2$ film 23, is referred to as a "reinforcement 23a".

A strain detection circuit (e.g., bridge circuit) using gauge resistors is provided in a surface layer and on a top surface of the Si thin film 24 in order to detect deformation of the diaphragm 25 caused by a pressure. The strain detection circuit is made up of a plurality of gauge resistors. Among them, just two gauge resistors 30A and 30B are shown in FIG. 2.

In the gauge resistor 30A, a piezoresistor 27a is formed between resistors 28a and 29a made of $p^+$-type diffusion resistance layers. In the gauge resistor 30B, a piezoresistor 27b is formed between resistors 28b and 29b made of $p^+$-type diffusion resistance layers. The other gauge resistors have the same structure as the gauge resistors 30A and 30B.

The gauge resistors 30A, 30B and so on are connected by a wiring pattern 31 made of a metal film to constitute a strain detection circuit. In the region except a top surface of the diaphragm 25, the top surface of the Si thin film 24 is covered with an insulating coating film 41, and the wiring pattern 31 is arranged on a top surface of the insulating coating film 41 in a region outside the diaphragm 25, with an end of the wiring pattern 31 connected to the resistors 29a, 29b and so on. In the region except the top surface of the diaphragm 25, a protective film 42 covers above the insulating coating film 41 in a manner to cover part of the resistors 29a, 29b and so on and the wiring pattern 31. Note that the strain detection circuit is made of a combination of the gauge resistors 30A, 30B and so on and the wiring pattern 31. However, a specific configuration of the strain detection circuit is not essential to the invention, and therefore a description thereof is not given.

Figure 3A:
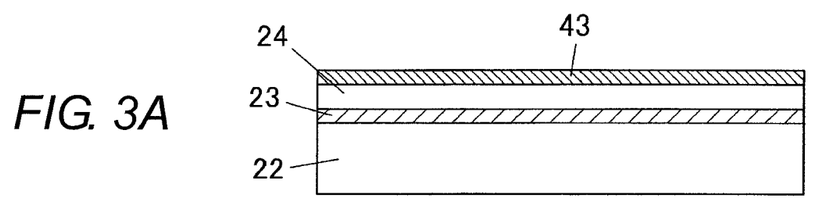
FIGS. 3A to 3E are schematic cross-sectional views showing a method of manufacturing the pressure sensor of the first embodiment.
Figure 3B:
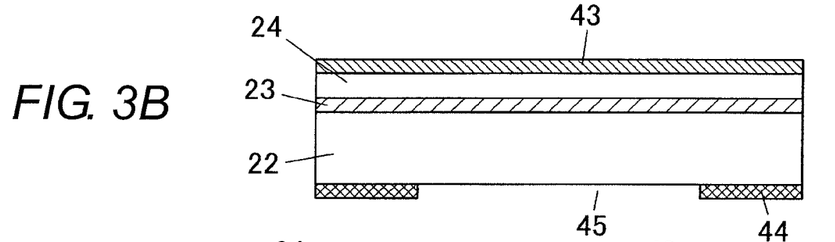

With reference to FIGS. 3A to 3E, a method of manufacturing the pressure sensor 21 of the first embodiment is described. Shown in FIG. 3A is an SOI substrate obtained by bonding the N-type Si substrate 22 and the N-type Si thin film 24 with the $SiO_2$ film 23 interposed therebetween. On the top surface of the Si thin film 24 of the SOI substrate, a strain detection circuit including the gauge resistors 30A, 30B and so on, the insulating coating film 41, the wiring pattern 31, and the protective film 42 is formed. In order to protect these components, a surface protective film 43 is provided on the components such that the entire top surface of the Si thin film 24 is covered with the surface protective film 43. Note that while, actually, a plurality of pressure sensors 21 among the plurality of pressure sensors 21 are manufactured at a time using an SOI wafer, only one pressure sensor 21 is shown in FIGS. 3A to 3E. First, as shown in FIG. 3B, a resist 44 is applied over an entire bottom surface of the Si substrate 22. After the resist 44 is cured by baking, an opening 45 is made, using a photolithography technique, in the resist 44 at a position where the recess 26 is to be formed. The resist 44 used here has a resistance to a dry etching process.

Figure 3C:
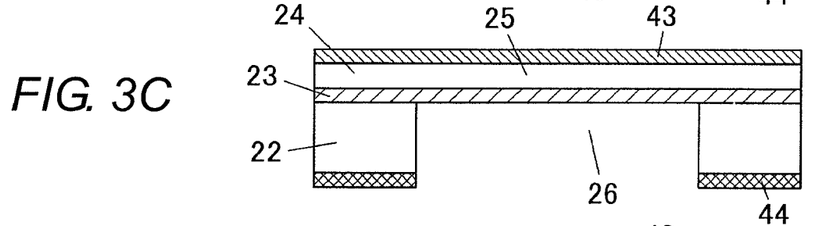

Subsequently, anisotropic etching of the Si substrate 22 is performed through the opening 45 of the resist 44 by a dry etching process, digging down the recess 26. The etching is performed until the bottom surface of the $SiO_2$ film 23 is exposed as shown in FIG. 3C. At this point, since the $SiO_2$ film 23 serves as an etching stopper layer, the etching stops with the entire $SiO_2$ film 23 being exposed in the recess 26. As the dry etching process, methods such as deep-reactive ion etching (RIE) are used.

Further, the $SiO_2$ film 23 is etched through the opening 45 of the resist 44 by the dry etching process. At this point, the etching of the $SiO_2$ film 23 is performed as dry etching at two separate stages as follows.

Figure 3D:
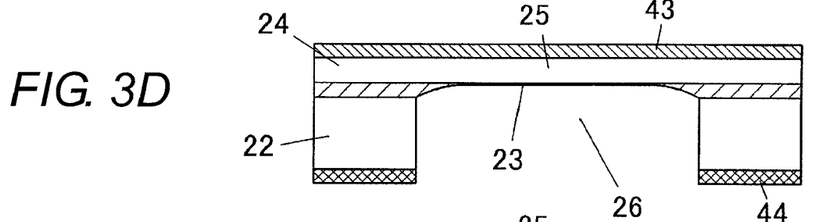

In dry etching at a first stage, etching is performed up to a midpoint of the $SiO_2$ film 23 at a relatively fast etching rate. In cases where the recess 26 in a structure as shown in FIG. 3D is manufactured by dry etching here, there is a tendency that ions for etching are reflected from a side wall of the recess 26 to concentrate upon a central portion. The progress of etching is therefore fast at the central portion and is slow at a peripheral portion. Accordingly, as shown in FIG. 3D, the central portion of the $SiO_2$ film 23 is thinner than its peripheral portion by dry etching. In the dry etching at the first stage, the process time can be reduced by using etching conditions that make the etching rate as fast as possible without using the ratio of etching rates (etching selectivity) of $SiO_2$ and Si.

Figure 3E:
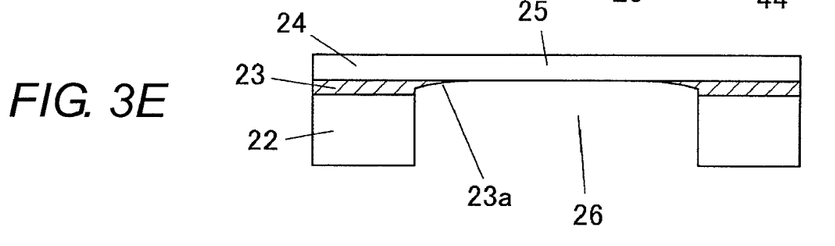

Subsequently, at an appropriate timing immediately before the Si thin film 24 is exposed in the central portion of the recess 26, etching is changed to etching at the second stage with an etching selectivity higher (i.e., the etching rate of $SiO_2$ is faster than the etching rate of Si) than that at the first stage. In etching at the second stage, the progress of etching is fast in the central portion and is slow in the peripheral portion, just as at the first stage. However, after the Si thin film 24 is exposed in the central portion, etching of the $SiO_2$ film 23 is faster than etching of the Si thin film 24. Therefore, as shown in FIG. 3E, in the region except the periphery of the recess 26, the $SiO_2$ film 23 is completely removed by etching to expose the bottom surface of the diaphragm 25. In the peripheral portion, a small amount of the $SiO_2$ film 23 is left to constitute the reinforcement 23a. In the remaining $SiO_2$ film 23 in the peripheral portion, the more outer portion is used for etching, the more slow etching is performed. The bottom surface of the $SiO_2$ film 23 tapers off, and its film thickness decreases from the outside toward the inside. The shape of the reinforcement 23a remaining in the peripheral portion can be adjusted by a timing at which the etching at the second stage stops.

Thereafter, the resist 44 on the bottom surface and the surface protective film 43 on the top surface are removed by dry etching or wet etching, thereby obtaining the pressure sensor 21.

Note that while dry etching is used for forming a recess in the foregoing manufacturing method, wet etching with tetramethyl ammonium hydroxide (TMAH) and KOH may be used. Dry etching has advantages in that cleaning is not required as a post-process, the selectivity to resists is high, and microfabrication is possible. On the other hand, wet etching has an advantage in that the required device is low-priced.

The pressure sensor 21 of this embodiment has the following effects.

The outer circumferential edge of the diaphragm 25 is fixed to the $SiO_2$ film 23 or the Si substrate 22, and stress concentration is likely to occur during deformation of the diaphragm 25. Accordingly, there is a possibility that cracking occurs in the diaphragm 25 and the diaphragm 25 is broken. However, the pressure sensor 21 has tapered reinforcement 23a at the top outer circumference of the recess 26, and therefore the outer circumferential edge of the diaphragm 25, at which large stress is likely to concentrate, is reinforced by the reinforcement 23a. This enables strength of a stress concentration portion of the diaphragm 25 to be improved. With the strength improvement, reliability of the pressure sensor 21 can also be improved. In particular, the reinforcement 23a tapers off. The farther the reinforcement 23a extends, the more the thickness decreases. The shape is best suited to dispersing stress to prevent the diaphragm 25 from breakage.

In the pressure sensor 21, the bottom surface of the diaphragm 25 is not etched. As a result, the film thickness of the diaphragm 25 is equal to the film thickness of a fixing portion of the Si thin film 24. This reduces variations in sensitivity of the pressure sensor 21 resulting from variations in film thickness of the diaphragm 25 that occur in manufacturing processes. Thus, a diaphragm structure with stable sensitivity characteristics can be achieved.

The taper shape of the reinforcement 23a can be controlled by adjusting a timing at which etching stops. Therefore, by varying the amount of tapering of the reinforcement 23a, required sensitivity in accordance with applications and reliability can be obtained.

In the pressure sensor 21 of the first embodiment, at the time of etching the recess 26 from the bottom surface, processing of the recess 26 can be performed in a state of being approximately in perpendicular to the diaphragm 25. This allows the size of the pressure sensor 21 to be reduced, allowing cost reduction.

Next, a description is given of results of examining a relationship between a remaining width S of the reinforcement 23a and characteristics of the diaphragm 25 by a simulation. The remaining width S of the reinforcement 23a, as used herein, is a horizontal distance measured from a side surface of the recess 26 to the tip of the reinforcement 23a as shown in FIG. 2. The radius of the diaphragm 25 used for the simulation is 400 μm.

Figure 4:
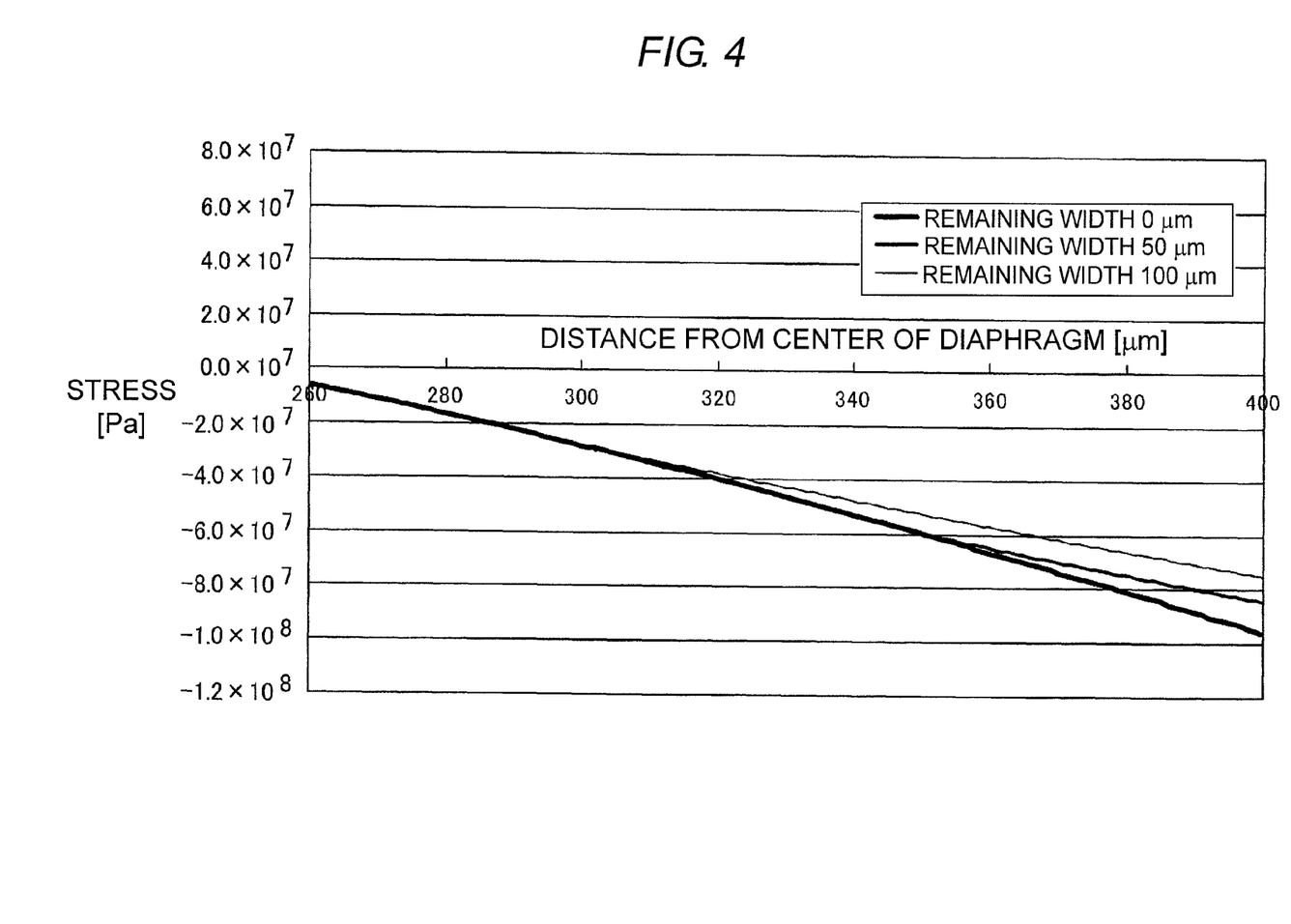
FIG. 4 shows a relationship between a distance measured from the center of a diaphragm and a stress at the distance in each of the case of a remaining width of a reinforcement of 0 μm, the case of 50 μm, and the case of 100 μm.

FIG. 4 shows calculated results of a relationship between a distance measured from the center of the diaphragm 25 and a stress (calculated value) at the distance in each of the case of the remaining width S of the reinforcement 23a of 0 the case of 50 μm, and the case of 100 μm.

This stress represents a stress that functions in parallel to the surface direction of the diaphragm 25 when a certain amount of stress is applied to the bottom surface of the diaphragm 25, and has a positive value in the case of tensile stress and has a negative value in the case of compressive stress. When a stress is applied to the diaphragm 25, a tensile stress acts near the central portion of the diaphragm 25 and a compressive stress acts near its end.

With reference to FIG. 4, the stress is largest at a position of 400 μm, which is, the fixed edge of the diaphragm 25. Comparing the case of the remaining width S of the reinforcement 23a of 50 μm with the case of 100 μm shows that the stress acting on the diaphragm 25 decreases more in the case of a larger remaining width S.

Figure 5:
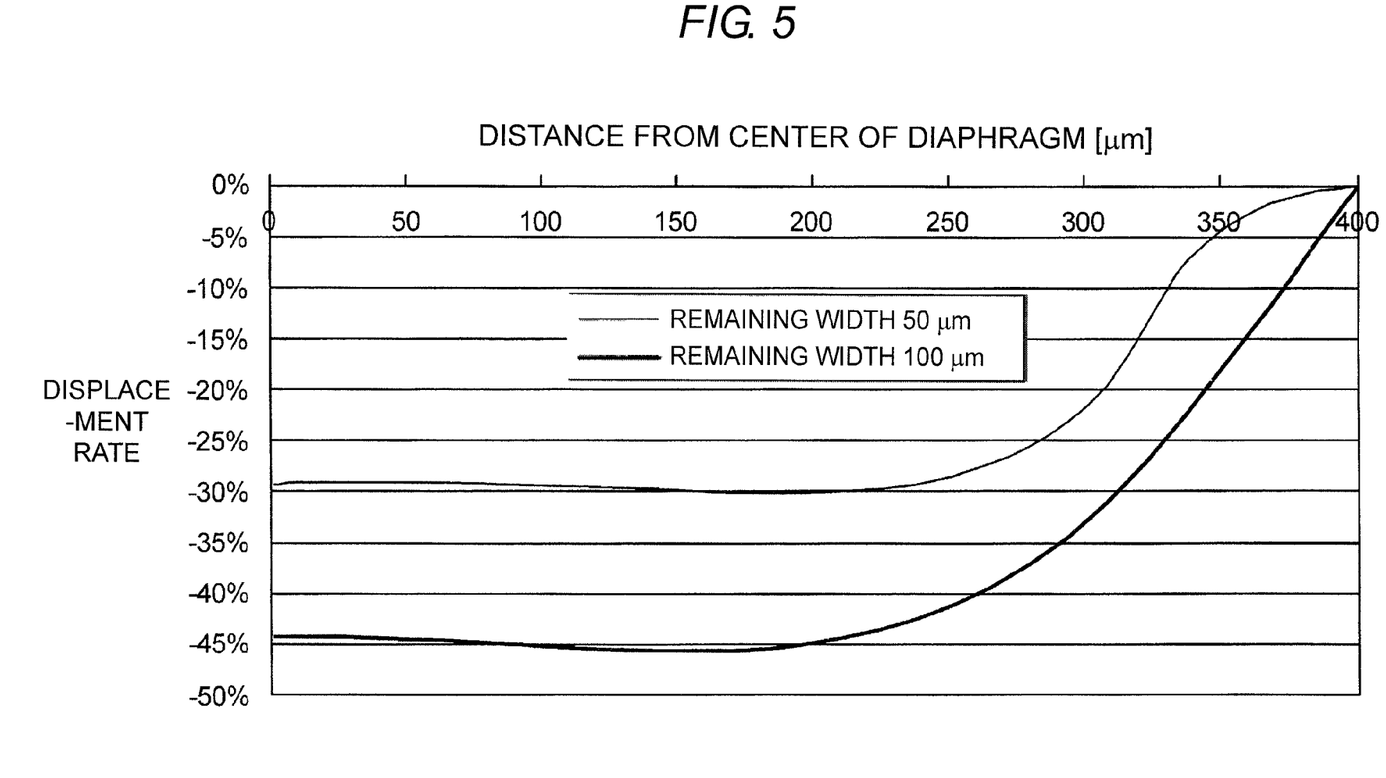
FIG. 5 shows a relationship between a distance measured from the center of the diaphragm and a displacement rate in the film direction of the diaphragm 25 at the distance in each of the case of the remaining width of the reinforcement of 50 μm, and the case of 100 μm.

FIG. 5 shows calculated results of a relationship between a distance measured from the center of the diaphragm 25 and a displacement rate (rate of displacement in the film direction) of the diaphragm 25 in the case of the remaining width S of 50 μm and in the case of 100 μm. The displacement rate is obtained on the basis of values of displacement calculated assuming that the same pressure is applied to the diaphragm 25 to deform the diaphragm 25 in the case of the remaining width S of the reinforcement 23a of 0 μm, in the case of 50 μm, and in the case of 100 μm.

The displacement rate shown in FIG. 5 is defined as follows. When displacement in the film direction of the diaphragm 25 with the reinforcement 23a having the remaining width S=0 μm is represented as d0, and displacement in the film direction of the diaphragm 25 with the reinforcement 23a having the remaining width S=50 μm at the same position as in the case of d0 is represented as d50, the displacement rate of the diaphragm 25 with the reinforcement 23a having the remaining width S of 50 μm is defined as follows:

100×(d50−d0)/d0[%]

Likewise, the displacement rate of the diaphragm 25 with the reinforcement 23a having the remaining width S of 100 μm is defined, assuming that displacement in the film direction of the diaphragm 25 at the same position as the displacement rate is d100, as follows:

100×(d100−d0)/d0[%]

With reference to FIG. 5, the larger the remaining width S of the reinforcement 23a is, the more displacement in the film direction of the diaphragm 25 decreases. This shows that the sensitivity of the pressure sensor 21 is degraded. Accordingly, when the reinforcement 23a is provided, the optimal remaining width needs to be determined in accordance with a requirement specification for sensitivity and reliability (durability) of the pressure sensor 21.

Second Embodiment

Figure 6:
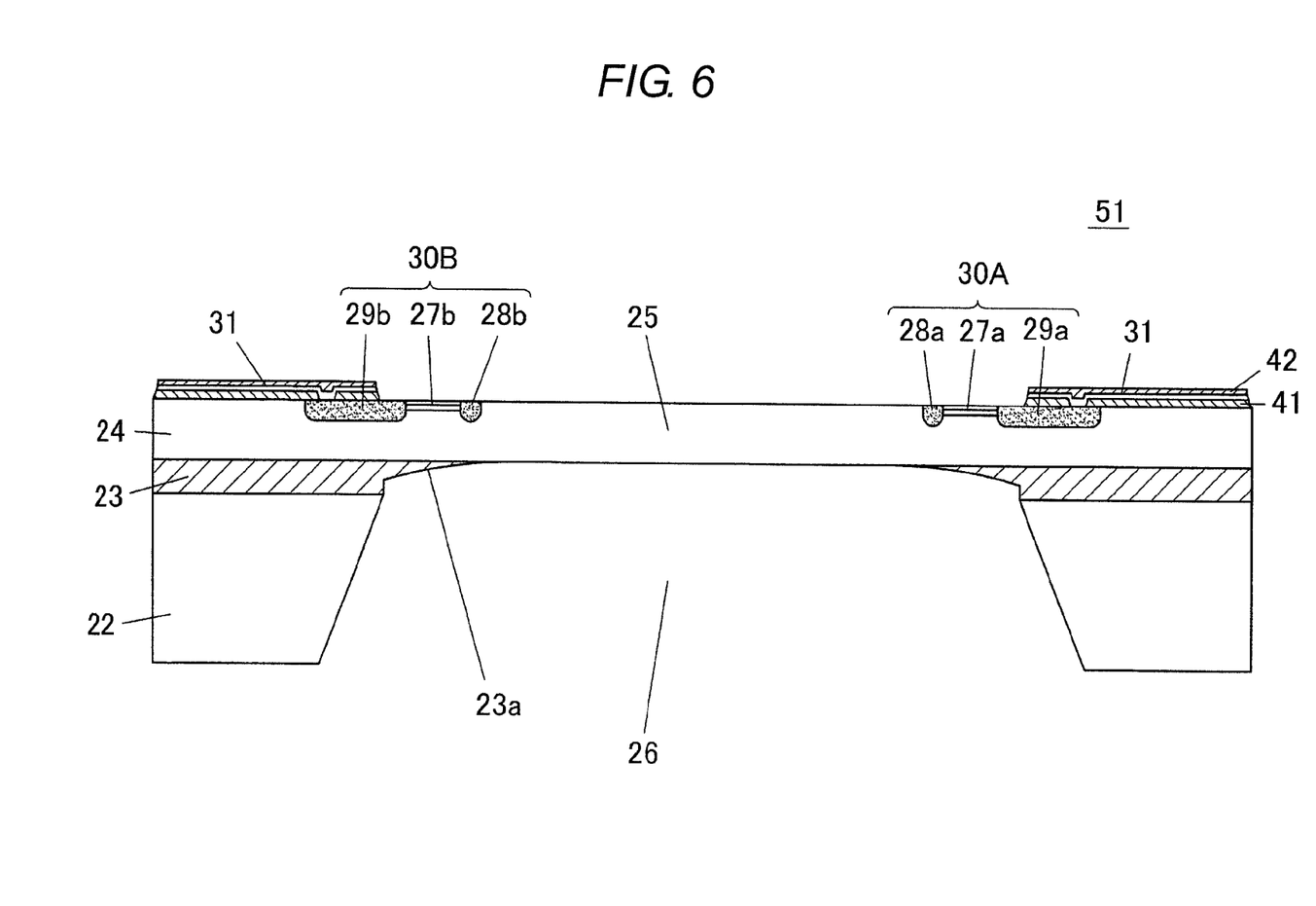
FIG. 6 is a cross-sectional view of a pressure sensor of a second embodiment of the invention.

FIG. 6 is a cross-sectional view showing a pressure sensor 51 according to a second embodiment of the invention. In this embodiment, the recess 26 has a tapered top such that the horizontal cross-sectional area of the recess 26 increases from the top toward the bottom.

Figure 7A:
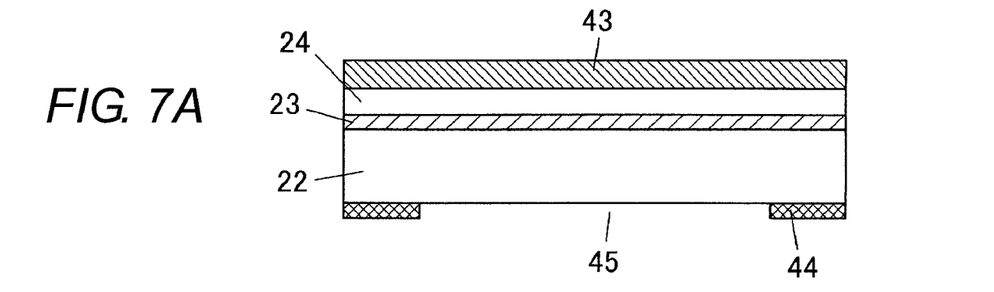
FIGS. 7A to 7D are cross-sectional views showing a method of manufacturing the pressure sensor of the second embodiment.

FIGS. 7A to 7D are cross-sectional views showing a method of manufacturing the pressure sensor 51 of the second embodiment. FIG. 7A shows the same SOI substrate as that in FIG. 3B described in the manufacturing method of the first embodiment. The resist 44 is formed on the bottom surface of the Si substrate 22, and the opening 45 is made in the resist 44. However, a material resistant to an etchant used in a wet etching process, such as TMAH and KOH, is used as the resist 44.

Figure 7B:
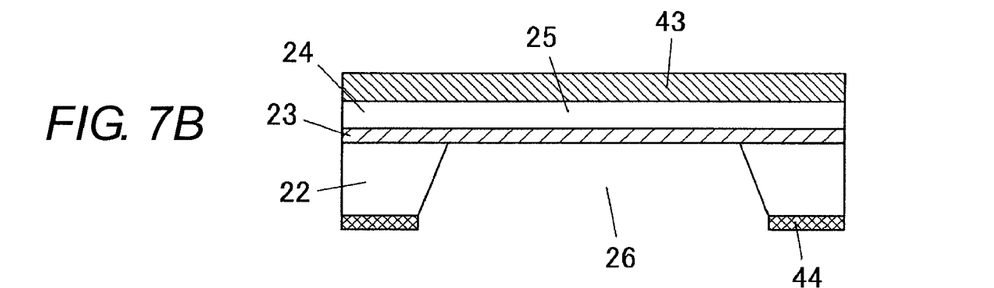

Subsequently, anisotropic etching of the Si substrate 22 is performed through the opening 45 of the resist 44 by a wet etching process, digging down the recess 26 in a tapered shape. The etching is performed until the bottom surface of the $SiO_2$ film 23 is exposed as shown in FIG. 7B. At this point, since the $SiO_2$ film 23 serves as an etching stopper layer, the etching stops with the entire $SiO_2$ film 23 being exposed in the recess 26.

Further, the $SiO_2$ film 23 is etched through the opening 45 of the resist 44 by the dry etching process, thereby forming the recess 26. At this point, dry etching is performed at two separate stages as in the first embodiment.

Figure 7C:
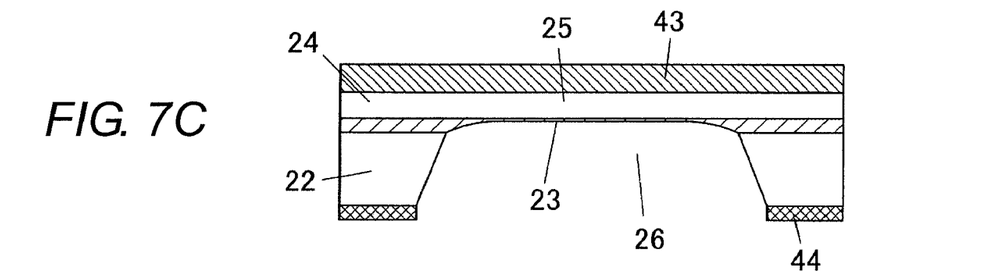

First, in dry etching at a first stage, etching is performed up to a midpoint of the $SiO_2$ film 23 at a relatively fast etching rate. As a result of the dry etching at the first stage, as shown in FIG. 7C, the central portion of the $SiO_2$ film 23 is thinner than its peripheral portion.

Figure 7D:
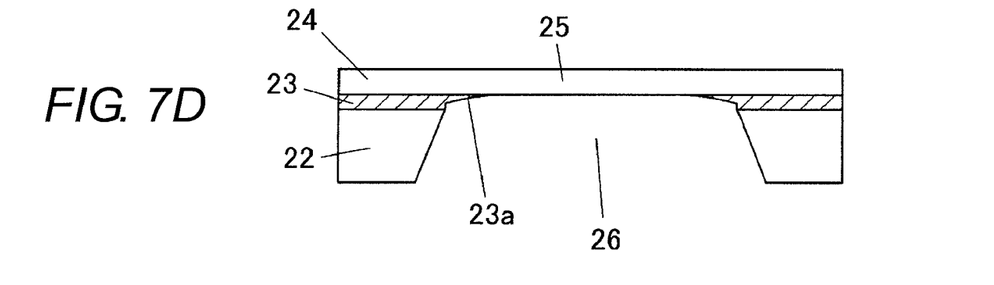

Subsequently, at an appropriate timing immediately before the Si thin film 24 is exposed in the central portion of the recess 26, etching is changed to etching at the second stage with an etching selectivity higher (i.e., the etching rate of $SiO_2$ is faster than the etching rate of Si) than that at the first stage. In etching at the second stage, the progress of etching is fast in the central portion and is slow in the peripheral portion, just as at the first stage. However, after the Si thin film 24 is exposed in the central portion, etching of the $SiO_2$ film 23 is faster than etching of the Si thin film 24. Therefore, as shown in FIG. 7D, in the region except the periphery of the recess 26, the $SiO_2$ film 23 is completely removed by etching to expose the bottom surface of the diaphragm 25. In the peripheral portion, a small amount of the $SiO_2$ film 23 is left to constitute the reinforcement 23a in a tapered shape.

Thereafter, the resist 44 on the bottom surface and the surface protective film 43 on the top surface are removed by dry etching or wet etching, thereby obtaining a pressure sensor 51.

A semiconductor sensor according to one or more embodiments of the invention is not limited to pressure sensors, and may be applied to any semiconductor sensor including a diaphragm. For example, according to one or more embodiments of the invention may be used for vibration sensors, microphones, flow rate sensors and the like other than pressure sensors.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A semiconductor sensor comprising:
    a first semiconductor layer as a base;
    an insulating layer formed on the first semiconductor layer; and
    a second semiconductor layer formed on the insulating layer, wherein
        a recess is formed from a bottom surface of the first semiconductor layer up to a top surface of the insulating layer,
        the second semiconductor layer is covered with the insulating layer in an outer circumference of a top surface of the recess, and
        a sensitive region of the second semiconductor layer is exposed in a region except the outer circumference of the top surface of the recess, and
    wherein in the insulating layer covering the second semiconductor layer in the outer circumference of the top surface of the recess, a reinforcement film thickness of the insulating layer becomes thinner from an outer circumference side of the sensitive region toward a center of the sensitive region, wherein a surface of the reinforcement film is shaped as a concave arc.

2. The semiconductor sensor according to claim 1, wherein the sensitive region has a film thickness equal to a film thickness of a region other than the sensitive region of the second semiconductor layer.

* * * * *